(12) United States Patent  
Kang et al.

(10) Patent No.: US 7,701,044 B2
(45) Date of Patent: Apr. 20, 2010

(54) CHIP PACKAGE FOR IMAGE SENSOR AND METHOD OF MANUFACTURING THE SAME

(75) Inventors: Byoung-young Kang, Seongnam-si (KR); San-deok Hwang, Seongnam-si (KR)

(73) Assignee: Samsung Techwin Co., Ltd., Changwon (KR)

( * ) Notice: Subject to any disclaimer, the term of this patent is extended or adjusted under 35 U.S.C. 154(b) by 331 days.

(21) Appl. No.: 11/906,481

(22) Filed: Oct. 2, 2007

(65) Prior Publication Data
US 2008/0093721 A1 Apr. 24, 2008

(30) Foreign Application Priority Data
Oct. 19, 2006 (KR) ................... 10-2006-0102038

(51) Int. Cl.
*H01L 23/02* (2006.01)
(52) U.S. Cl. ............... 257/680; 257/678; 257/723; 257/731; 257/773; 257/778; 257/E31.054; 257/E23.001; 257/E23.178; 257/E21.499; 257/E21.503; 257/E25.005; 257/E24.023

(58) Field of Classification Search ........... 257/77–796, 257/E23.001–E23.194, E31.075–E31.084, 257/E27.15–E27.163, 219, 225, 239, 240, 257/241, 246, E27.082–E27.083, E29.065, 257/E29.227–E29.24; 438/109, FOR. 368, 438/FOR. 426
See application file for complete search history.

(56) References Cited

U.S. PATENT DOCUMENTS 7,534,645 B2 * 5/2009 Choi ........................... 438/64
2003/0124773 A1 * 7/2003 Hashimoto .................. 438/127

* cited by examiner

*Primary Examiner*—Jasmine J Clark
(74) *Attorney, Agent, or Firm*—Drinker Biddle & Reath LLP

(57) ABSTRACT

A chip package for an image sensor includes a first semiconductor chip having a first surface where a photographing device and a first circuit pattern are formed and a second surface that is opposite to the first surface where a second circuit pattern is formed. The first and second circuit patterns are electrically connected. The chip package further includes a second semiconductor chip attached to a second circuit pattern on the second surface of the first semiconductor chip. A printed circuit board faces the second surface of the first semiconductor chip and transfers an electric signal between the first and second semiconductor chips and externally. A housing accommodates the first and second semiconductor chips. The housing allows light to pass through to the photographing device.

22 Claims, 8 Drawing Sheets

CHIP PACKAGE FOR IMAGE SENSOR AND METHOD OF MANUFACTURING THE SAME

CROSS-REFERENCE TO RELATED PATENT APPLICATIONS

This application claims the benefit of Korean Patent Application No. 10-2006-0102038, filed on Oct. 19, 2006, in the Korean Intellectual Property Office, the disclosure of which is incorporated herein in its entirety by reference.

BACKGROUND OF THE INVENTION

1. Field of the Invention

The present invention relates to a chip package for an image sensor and a manufacturing method thereof, and more particularly, to a chip package for an image sensor which reduces the volume of a camera module including an image sensor, a digital signal processor, a memory, and a PCB by combining the above parts into a single package, and a manufacturing method thereof.

2. Description of the Related Art

An image sensor is a device that changes light indicating an image of an object into an electric signal for each pixel. An image sensor is used for small electronic products capable of photographing still images and motion pictures, for example, digital cameras, mobile phones, PDAs (personal digital assistants), rear view monitoring cameras included in bumpers, and interphones. The image sensor includes a charge coupled device (CCD) and a complementary MOSFET oxidized semiconductor (CMOS). The image sensor is a type of semiconductor chip.

A semiconductor chip is packaged for protection from external shocks, the environment and the exchange of electric signals with the outside. An image sensor chip is connected to a digital signal processor (DSP) to process an electric signal output from the image sensor chip and to a memory to store image information. Also, the image sensor chip is electrically interconnected to a flexible printed circuit board (FPCB) and a hard printed circuit board (HPCB) to exchange electric signals with an electronic device outside a camera module.

FIGS. 1 and 2 are sectional views showing conventional chip packages for an image sensor. Referring to FIG. 1, an image sensor chip 1 is wire-bonded to the upper surface of an HPCB 6 via a metal wire 3. A DSP 7 is electrically connected to the HPCB 6 by being flipchip bonded to the lower surface of the HPCB 6. An infrared (IR) cut filter 9 to cut an unnecessary infrared ray is arranged above an image sensor 2. Since the DSP 7 is located at the lower surface of the HPCB 6, it is difficult to reduce the volume of the chip package so that the miniaturization of electronic products is difficult.

Referring to FIG. 2, the image sensor chip 1 is arranged at the lowermost position of a housing 4. A peripheral part of the upper surface of the image sensor chip 1 is electrically connected to the FPCB 8 via flip chip bonding 1a. The DSP 7 is located at a portion of the FPCB 8 positioned outside the housing 4. Thus, it is difficult to reduce the volume of the chip package and thereby reduce the size of an electronic product, such as a camera, containing the chip package.

SUMMARY OF THE INVENTION

To solve the above and/or other problems, the present invention provides a chip package for an image sensor which can incorporate an image sensor, a digital signal processor, a memory, and a PCB into a single package so that the volume of a camera module including the above parts is reduced, and a manufacturing method for a chip package for an image sensor.

According to an aspect of the present invention, a chip package for an image sensor comprises a first semiconductor chip having a first surface where a photographing device and a first circuit pattern are formed and a second surface that is opposite to the first surface where a second circuit pattern is formed, the first and second circuit patterns being electrically connected, a second semiconductor chip attached to the second circuit pattern, a printed circuit board facing the second surface of the first semiconductor chip and transferring an electric signal between the first and second semiconductor chips and external to the chip package for an image sensor, and a housing accommodating the first and second semiconductor chips with the printed circuit board and having an opening to allow light incident on the photographing device to pass.

The circuit patterns on the first and second surfaces of the first semiconductor chip are electrically connected by filling a through hole or a via hole formed in the first semiconductor chip with tungsten in a chemical vapor deposition method. The second circuit pattern of the first semiconductor chip is flip chip bonded to the printed circuit board so that the first and second semiconductor chips exchange an electric signal with the outside of the chip package for an image sensor. The second semiconductor chip may be a DSP chip and/or a memory chip.

Since the first semiconductor chip, the second semiconductor chip, and the printed circuit board are integrally packaged in a vertical direction, the volume of the chip package for an image sensor can be reduced. Also, since the first semiconductor chip, the second semiconductor chip, and the printed circuit board are interconnected by the flip chip interconnection, the degree of integration of the package can be increased and the electric characteristic and heat dissipation characteristic are improved.

Since an IR cut filter can be deposited on the surface of the photographing device of the first semiconductor chip, the size of the chip package for an image sensor can be further decreased.

At least a portion of the remaining space between the first semiconductor chip and the printed circuit board is filled with an electrically non-conductive material so that the shock-resistant characteristic and reliability of the chip package for an image sensor are improved.

According to another aspect of the present invention, a method of manufacturing a chip package for an image sensor comprises forming a first semiconductor chip by forming a photographing device and a first circuit pattern on a first surface of a die, forming a second circuit pattern on a second surface of the die, forming a via hole or a through hole in the die, electrically connecting the first and second circuit patterns via the via hole or the through hole, interconnecting at least one second semiconductor chip to the second circuit pattern in a flip chip bonding method, connecting the second circuit pattern on the second surface of the die to a printed circuit board, and fixing a housing having an opening through which light incident on the photographing device passes, to the printed circuit board.

The operations from the providing the first semiconductor chip to the interconnecting of the second semiconductor chip to the circuit pattern on the second surface of the first semiconductor chip are performed in a semiconductor wafer level. Thus, the time and costs for manufacturing the chip package for an image sensor are much reduced.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

Figure 1:
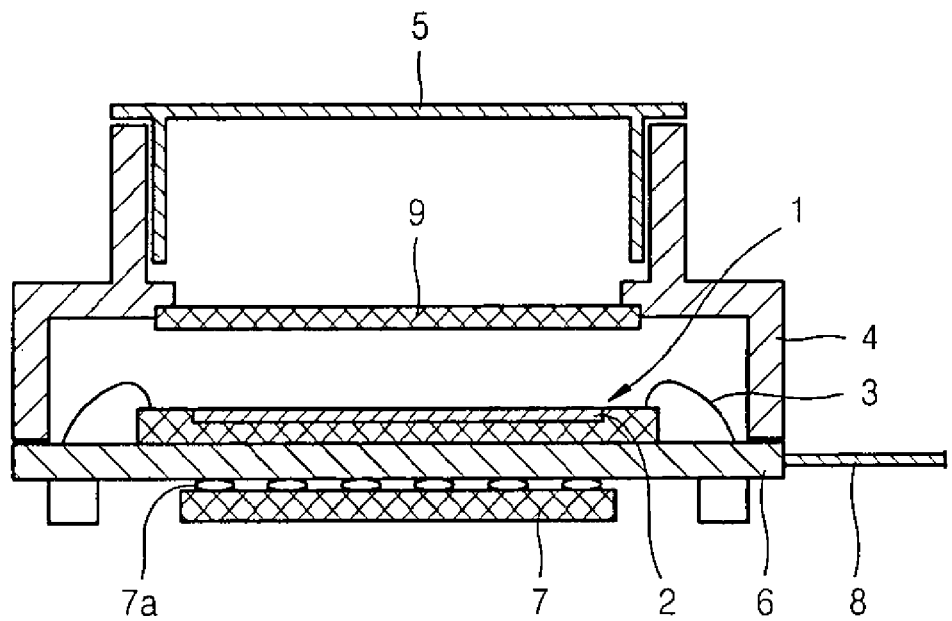
FIG. 1 is a sectional view of a conventional chip package for an image sensor.
Figure 2:
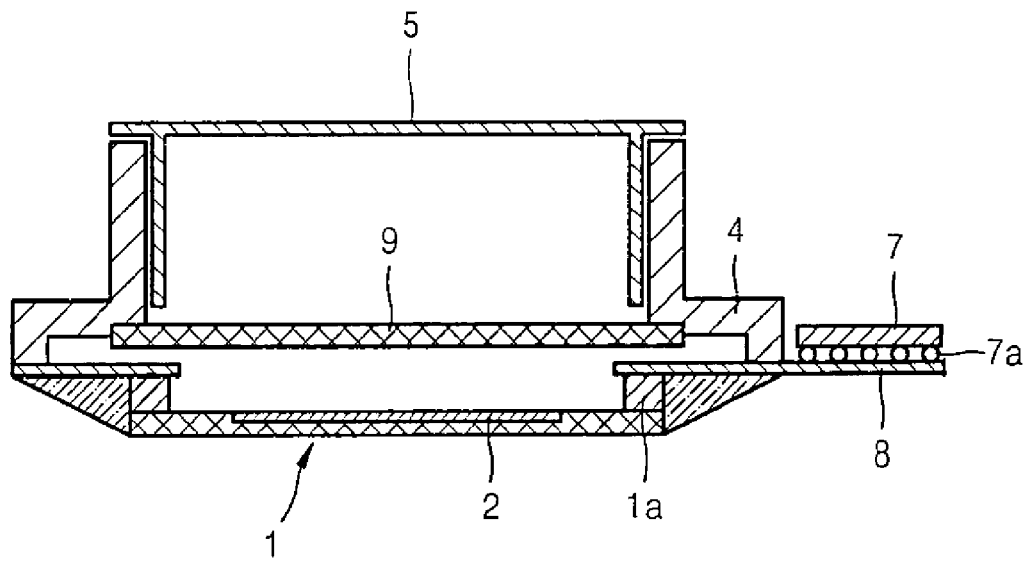
FIG. 2 is a sectional view of another conventional chip package for an image sensor.
Figure 3:
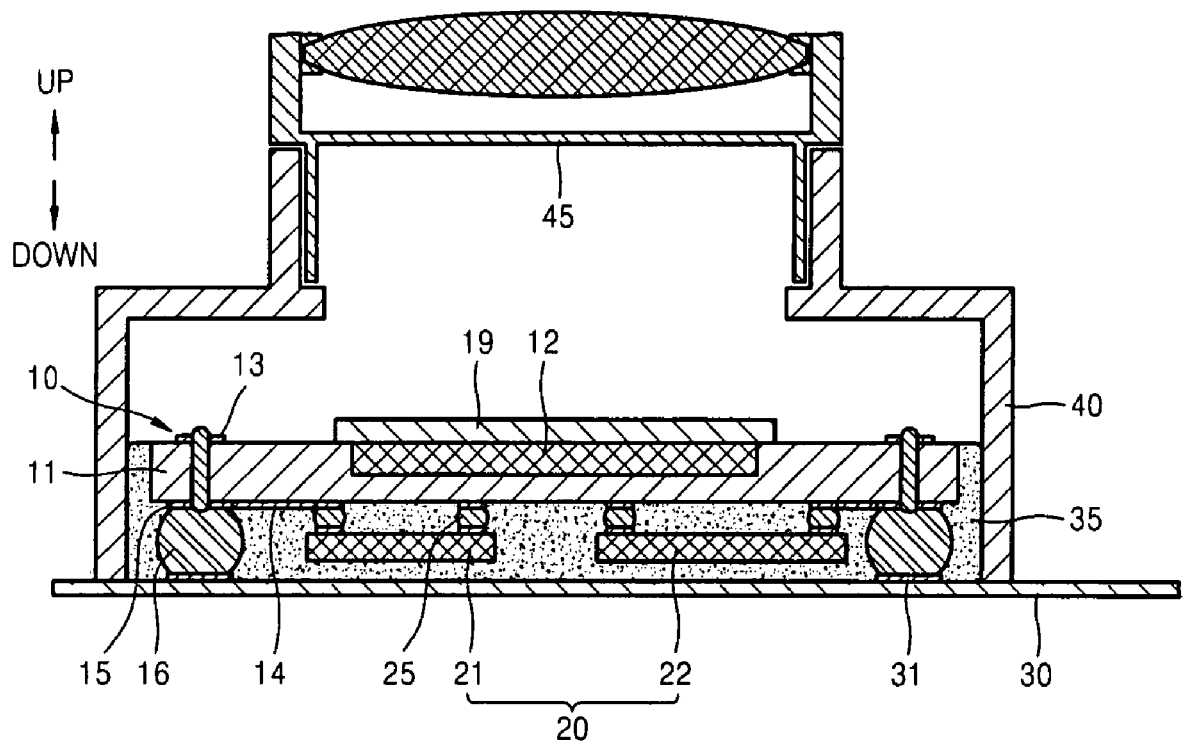
FIG. 3 is a sectional view of a chip package for an image sensor according to an embodiment of the present invention.
Figure 4:
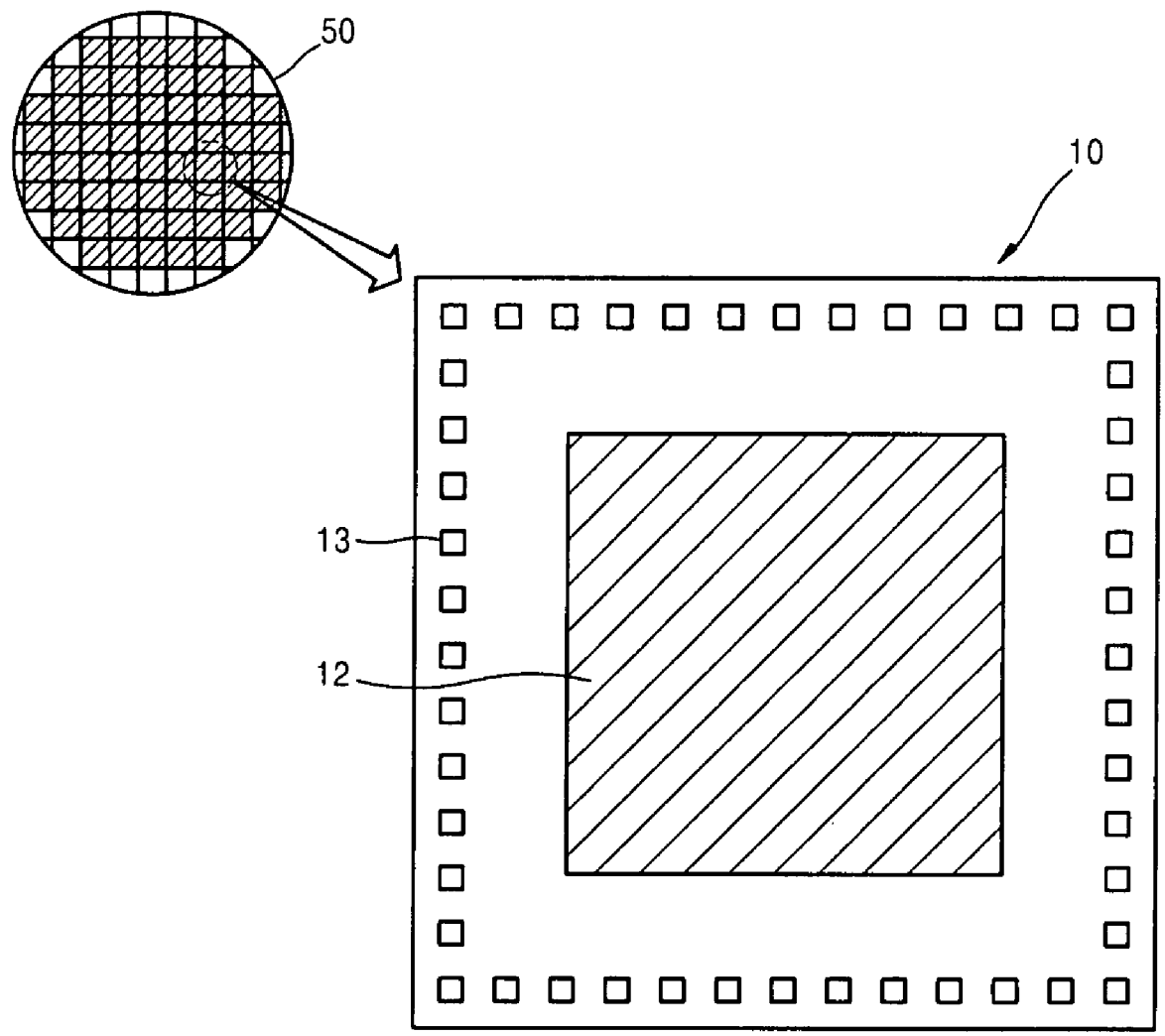
FIG. 4 is a top plan view of the chip package for an image sensor of FIG. 3.
Figure 5:
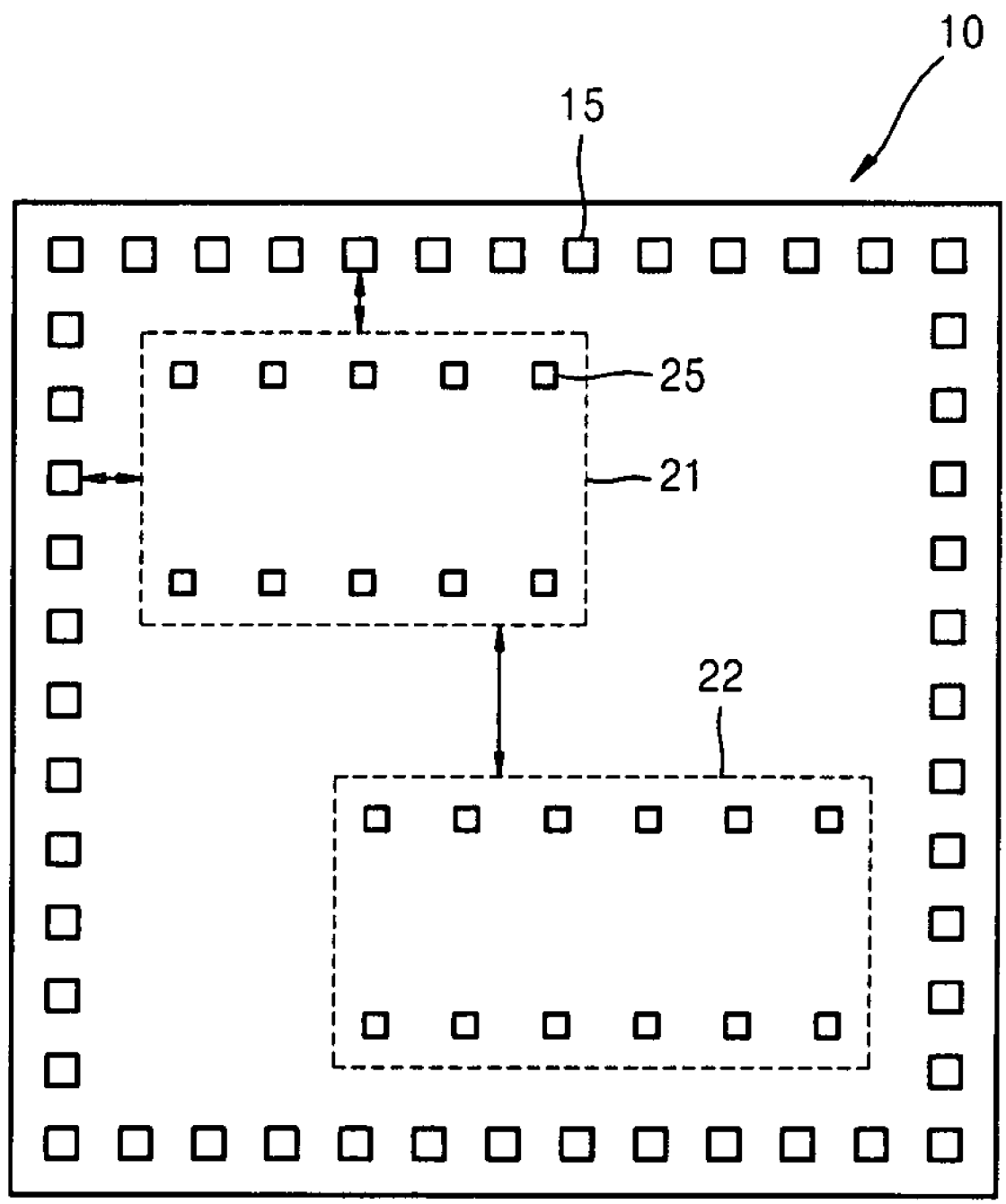
FIG. 5 is a bottom plan view of the chip package for an image sensor of FIG. 3.

FIG. 3 is a sectional view of a chip package for an image sensor according to an embodiment of the present invention. FIG. 4 is a top plan view of the chip package for an image sensor of FIG. 3. FIG. 5 is a bottom plan view of the chip package for an image sensor of FIG. 3.

Referring to FIGS. 3, 4, and 5, a chip package for an image sensor according to an embodiment of the present invention includes a first semiconductor chip 10. A photographing device 12 is formed on the upper surface of the first semiconductor chip 10. A predetermined circuit pattern 13 electrically connected to the photographing device 12 is formed on the upper surface of the first semiconductor chip 10 and/or inside the first semiconductor chip 10. That is, as shown in FIG. 4, the photographing device 12 is located at the center of the first semiconductor chip 10 and the circuit pattern including a chip bond pad 13 at the peripheral portion of the first semiconductor chip 10. The arrangement and number of the chip bond pad 13 may diversely vary.

A filter 19, for example, an infrared (IR) cut filter, can be formed on the photographing device 12. The filter 19 can be deposited on the upper surface of the first semiconductor chip 10 where the photographing device 12 is located in a CVD (chemical vapor deposition) or PVD (physical vapor deposition) method. In the present embodiment, unlike the conventional technology, there is no need for the wire bonding or flip chip bonding on the upper surface of the first semiconductor chip 10. As a result, deposition on the upper surface of the first semiconductor chip 10 is possible. Thus, since the filter 19 is not needed to be separately attached to the housing 40 above the first semiconductor chip 10, the volume of the chip package can be reduced.

Also, predetermined circuit patterns 14 and 15 including a conductive pad 15 are formed on the lower surface of the first semiconductor chip 10. The circuit patterns 13 on the upper surface of the first semiconductor chip 10 and the circuit patterns 14 including the chip bond pad 15 on the lower surface of the first semiconductor chip 10 are electrically connected via a via hole or a through hole. As shown in FIG. 5, a second semiconductor chip 20, for example, a digital signal processor (DSP) chip 21 and/or a memory chip 22, is electrically connected to a predetermined chip bond pad 15 of the circuit patterns 14 and 15 on the lower surface of the first semiconductor chip 10. As a result, an electric signal output from the photographic device 12 through the conductive pad 15 is transferred to the DSP chip 21 and/or the memory chip 22. Also, a flexible printed circuit board (FPCB) 30 is electrically connected to the chip bond pad 15. As a result, the photographing device 12, the DSP chip 21, and the memory chip 22 can exchange electrical signals with external parts.

The electric connection can be made in a variety of methods, preferably, in a flip chip bonding method. Also, the electric connection can be made in a tape automated bonding (TAB) method. That is, the first semiconductor chip 10 and the second semiconductor chip 20 are integrally deposited in a vertical direction. Thus, the volume of the chip package can be reduced. Also, the flip chip bonding has the following merits. That is, when the first semiconductor chip 10 and the second semiconductor chip 20 are coupled in the flip chip interconnection method, 1) eliminating bond wires reduces the required board area and requires far less height (smallest size), 2) flip chip offers the highest speed electrical performance (highest performance), 3) flip chip gives the greatest input/output connection flexibility (greatest I/O flexibility), 4) flip chip, when completed with an adhesive "underfill", are solid little blocks of cured epoxy so that flip chip is mechanically the most rugged interconnection method (most rugged), and 5) flip chip can be the lowest cost interconnection for high volume automated production (lowest cost).

Furthermore, passive devices (not shown) such as capacitors, resistors, and coils can be mounted to be electrically connected to the lower surface of the first semiconductor chip 10. As the method of electrically connecting the passive devices to the lower surface of the first semiconductor chip 10, in addition to the method of mounting individual passive devices, a method of integrating the passive devices on the lower surface of the first semiconductor chip 10 in the form of a thin film or a thick film can be used.

A bump 16 is formed on the chip bond pad 15 of the circuit patterns 14 and on the lower surface of the first semiconductor chip 10. The bump 16 is a conductive protrusion that can electrically connect the first semiconductor chip 10 to the circuit patterns 14 including the chip bond pad 15 in the flip chip interconnection or TAB method. The bump 16 is formed of a metal material such as gold (Au), solder, copper (Cu), conductive resin in which metal particles are mixed in resin, or a resin-metal composition material in which the metal material is coated on a resin surface. The position and number of the bump 16 are variable.

The bump 16 and a conductive pad 31 of the FPCB 30 are electrically connected in the flip chip bonding method. Consequently, the first semiconductor chip 10, the second semiconductor chip 20, and the FPCB 30 are integrally deposited in a direction from the upper surface toward the lower surface. Thus, the volume of the chip package for an image sensor can be reduced.

A space between the lower surface of the first semiconductor chip 10 and the FPCB 30 can be filled with underfill. Thus, the shock-resistant characteristic and reliability can be improved.

The housing 40 is coupled to the upper surface of the FPCB 30 to encompass the first semiconductor chip 10 and the second semiconductor chip 20. The upper side of the housing 40 is open. Screw threads are formed on the inner circumferential side of the upper portion of the housing 40 so that a lens assembly 45 can be screw coupled to the upper portion of the housing 40. Thus, the housing 40 protects the chip package for an image sensor from external shocks and environment and keeps sealing. A series of lenses, a barrel, and a zooming actuation member are coupled to the lens assembly 45.

According to the above structure, the chip package for an image sensor according to an embodiment of the present invention can be packaged to take less volume so that the volume of a camera module can be reduced much. As a result, the size of an electronic product having a camera module can be further reduced.

A method of manufacturing the chip package for an image sensor according to an embodiment of the present invention is described below with reference to FIGS. 6A through 6J.

Figure 6A:
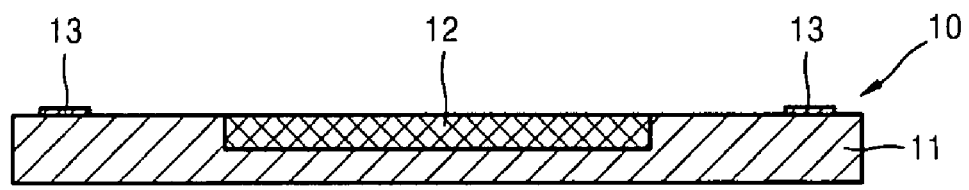
FIG. 6A illustrates a step of providing a first semiconductor chip by forming a photographing device and a circuit pattern on the upper surface of a die.

FIG. 6A illustrates a step of providing the first semiconductor chip 10 by forming the photographing device 12 and the circuit pattern 13 on the upper surface of a wafer die 11. Referring to FIG. 6A, the first semiconductor chip 10 is made from a silicon wafer. That is, the photographing device 12 is formed by processing the upper surface of the wafer die 11, for example, by selectively repeating a film forming process, a film patterning process, and an impurity doping process several times. The circuit pattern 13 is formed for wiring of the photographing device 12. The circuit pattern 13 is generally formed in a masking process after forming an aluminum thin film. The aluminum thin film can be formed, for example, in the PVD process. Also, a passivation layer (not shown) is further provided to protect the circuit pattern (13) layer. The step shown in FIG. 6A can be performed in a semiconductor wafer level as shown in FIG. 4.

After the step shown in FIG. 6A is complete, a step of grinding the lower surface of the wafer die 11 is additionally performed. This process is needed to make the wafer to have an appropriate thickness because the wafer is initially formed to be thick to easily handle the wafer during the process of forming the photographing device 12 in the wafer die 11. However, this grinding step is not necessary. In addition, a protection film can be formed to completely insulate the grinded lower surface of the wafer die 11.

Although it is not shown in the drawings, after the above step, a step of further forming the filter 19, for example, an IR cut filter, on the surface of the photographing device 12 of the first semiconductor chip 10 may be provided. The filter 19 can be deposited in the CVD or PVD method on the upper surface of the first semiconductor chip 10 where the photographing device 12 exists. When the filter 19 is not deposited on the upper surface of the first semiconductor chip 10, the filter 19 can be fixedly provided inside the housing 40.

Figure 6B:
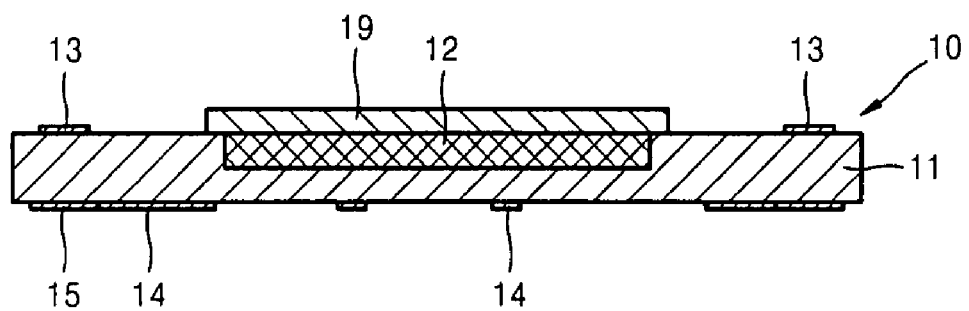
FIG. 6B illustrates a step of forming a circuit pattern on the lower surface of the first semiconductor chip.

FIG. 6B illustrates a step of forming the circuit patterns 14 and 15 on the lower surface of the first semiconductor chip 10. Referring to FIG. 6B, the circuit patterns 14 and 15 on the lower surface of the first semiconductor chip 10 can be formed in the same method as that used for forming the circuit pattern 13 on the upper surface of the first semiconductor chip 10. A passivation layer (not shown) to protect the circuit patterns 14 and 15 can further be formed. The step shown in FIG. 6B can be performed in the semiconductor wafer level.

Figure 6C:
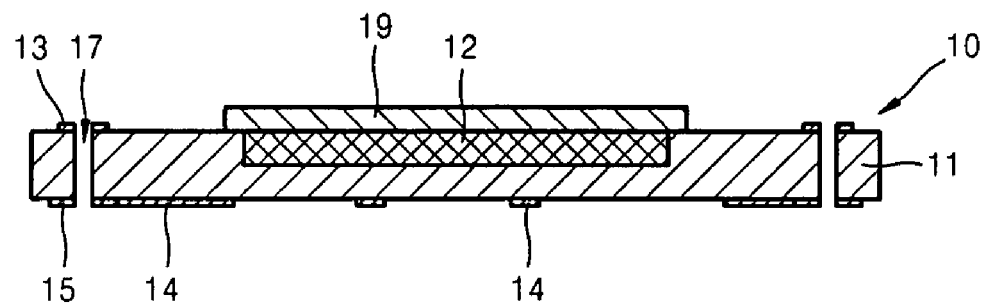
FIG. 6C illustrates a step of forming a via hole or through hole in the first semiconductor chip.

FIG. 6C illustrates a step of forming a via hole or through hole 17 in the first semiconductor chip 10. The hole 17 can be formed using mechanical drilling or laser drilling. The step shown in FIG. 6C can be performed in the semiconductor wafer level.

Figure 6D:
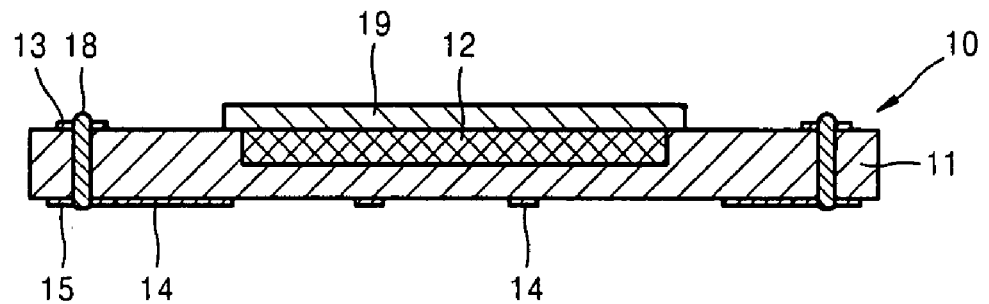
FIG. 6D illustrates a step of electrically connecting the circuit patterns formed on the upper and lower surfaces of the first semiconductor chip.

FIG. 6D illustrates a step of electrically connecting the circuit patterns 13 and 15 formed on the upper and lower surfaces of the first semiconductor chip 10. In this step, tungsten 18 is deposited in the via hole or through hole 17 in the CVD method or copper 18 is plated on the via hole or through hole 17 in an electro copper plating method. Thus, the circuit pattern 13 on the upper surface of the first semiconductor chip 10 and the circuit patterns 14 and 15 on the lower surface of the first semiconductor chip 10 are electrically connected. Since the hole forming method or interlayer electric connection method is well known, a detailed description thereof will be omitted herein. The step shown in FIG. 6D can be performed in the semiconductor wafer level.

Figure 6E:
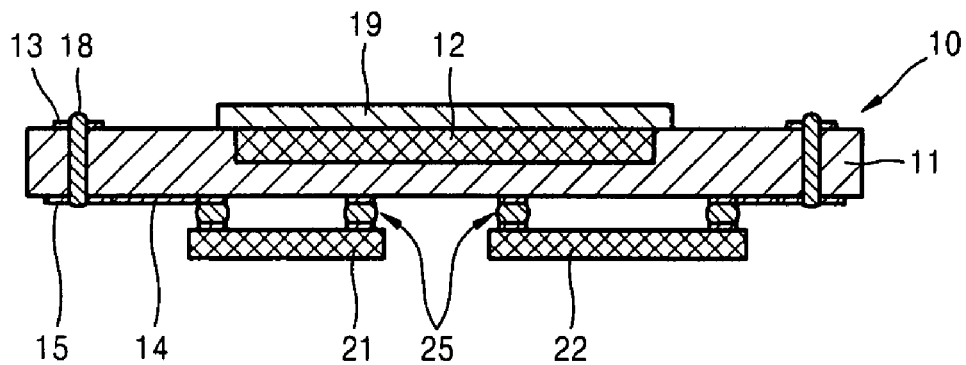
FIG. 6E illustrates a step of electrically connecting a second semiconductor chip to the circuit pattern on the lower surface of the first semiconductor chip.

FIG. 6E illustrates a step of electrically connecting the second semiconductor chip 20 to the circuit patterns 14 and 15 on the lower surface of the first semiconductor chip 10. The second semiconductor chip 20 may be the DSP chip 21 or the memory chip 22. Also, in the second semiconductor chip 20 that is electrically connected, any one or both of the DSP chip 21 and the memory chip 22 can be mounted on the first semiconductor chip 10.

The second semiconductor chip 20 can be electrically connected to the circuit patterns 14 and 15 on the lower surface of the first semiconductor chip 10 in the flip chip bonding or TAB method. To this end, a bump 25 is formed on the conductive pad of the second semiconductor chip 20. The bump 25 can be formed by many methods including, but not limited to, an evaporation method, an electroplating method, an electroless plating method, a screen printing method, a solder ball mounting method, a stud method, a needle-depositing method or a Super-Juffit method.

The second semiconductor chip 20 where the bump 25 is formed is arranged on the lower surface of the first semiconductor chip 10 and bonded in a direct attachment method. The direct attachment method may be a flip chip bonding, TAB or other method. According to the flip chip bonding method, the second semiconductor chip 20 is flipped such that the upper surface of the second semiconductor chip 20 faces the lower surface of the first semiconductor chip 10 and the bump 25 of the second semiconductor chip 20 is directly attached to the conductive pad of the lower surface of the first semiconductor chip 10. The flip chip bonding method can be performed using an anisotropic conductive film (ACF), a non-conductive paste (NCP), or a non-conductive film (NCF). In addition, the flip chip bonding method can be performed by a solder combination, a heat-pressure combination, a thermosonic combination. The step shown in FIG. 6E can be performed in the semiconductor wafer level.

Figure 6F:
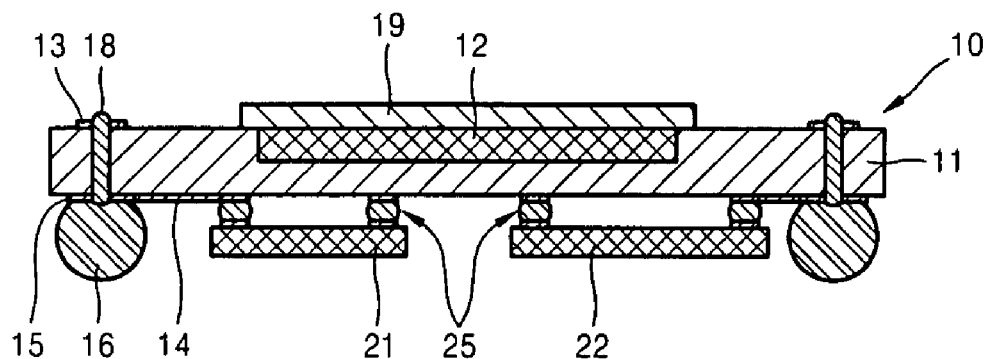
FIG. 6F illustrates a step of forming a bump on the circuit pattern on the lower surface of the first semiconductor chip.

FIG. 6F illustrates a step of forming the bump 16 on the circuit pattern 15 on the lower surface of the first semiconductor chip 10. The bump (16) forming method is similar to the above-described bump (25) forming method. The size of the bump 16 formed on the lower surface of the first semiconductor chip 10 can be appropriately adjusted such that the second semiconductor chip 20 is not located lower than the level of the lowermost portion of the bump 16. That is, the bump 16 formed on the lower surface of the first semiconductor chip 10 not only works as a device for electrically connecting the first semiconductor chip 10 and the FPCB 30, but also adjusts the height of the chip package for an image sensor to accommodate the second semiconductor chip 20 in a space between the first semiconductor chip 10 and the FPCB 30.

Figure 6G:
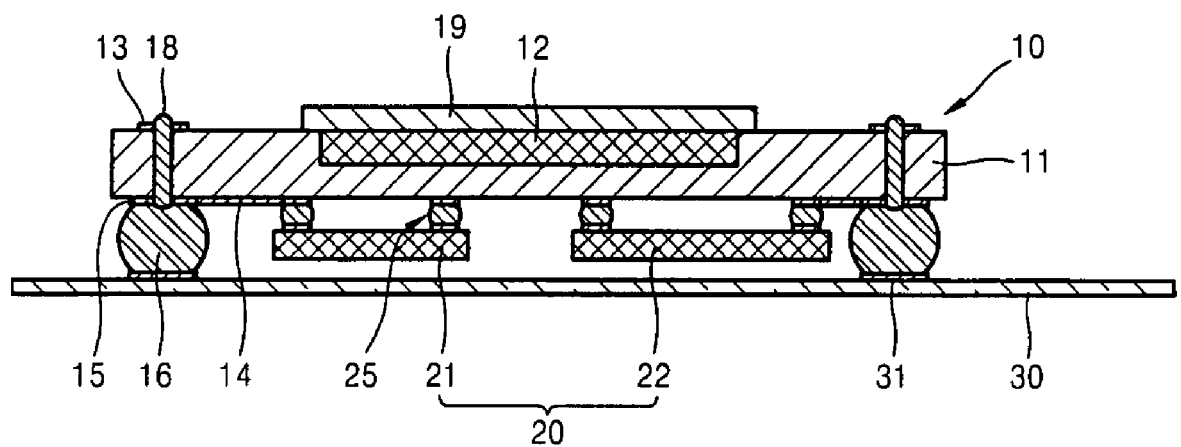
FIG. 6G illustrates a step of electrically connecting the circuit pattern on the lower surface of the first semiconductor chip to the FPCB.

FIG. 6G illustrates a step of electrically connecting the circuit pattern 15 on the lower surface of the first semiconductor chip 10 to the FPCB 30. The electric connection can be formed using a flip chip bonding, TAB or other method. The steps shown in FIGS. 6F and 6G can be performed in the semiconductor wafer level.

That is, the steps shown in FIGS. 6A through 6G can be performed in the semiconductor wafer level. Then, after sawing or singularizing the wafer die 11, the remaining steps can be performed. As a result, lots of steps of the chip packaging for an image sensor can be performed in the wafer level so that the manufacturing steps can be performed quickly and the manufacturing cost can be reduced.

Figure 6H:
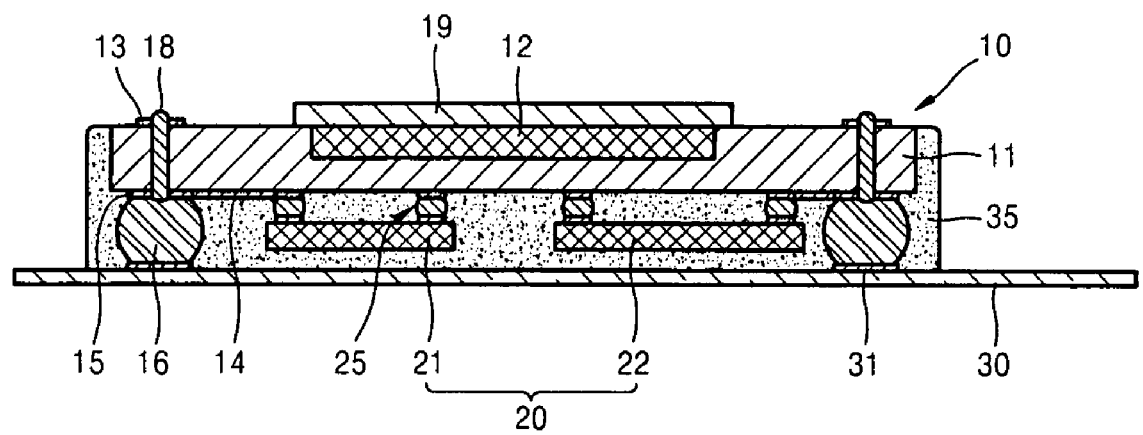
FIG. 6H illustrates a step of filling a remaining space between the first semiconductor chip and the FPCB with an electrically non-conductive material.

FIG. 6H illustrates a step of filling underfill in a space between the first semiconductor chip 10 and the FPCB 30. After the first semiconductor chip 10 and the FPCB 30 are electrically connected to each other, the underfill is performed to fill the space therebetween. The underfill can be flow, no-flow, wafer level or other type. In the present embodiment, thermosetting sealant is dispensed to the side surface of the first semiconductor chip 10 so that the sealant permeates through the space according to a capillary phenomenon. Then, as the sealant is cured, the shock-resistant characteristic and reliability of the chip package for an image sensor can be improved.

Figure 6I:
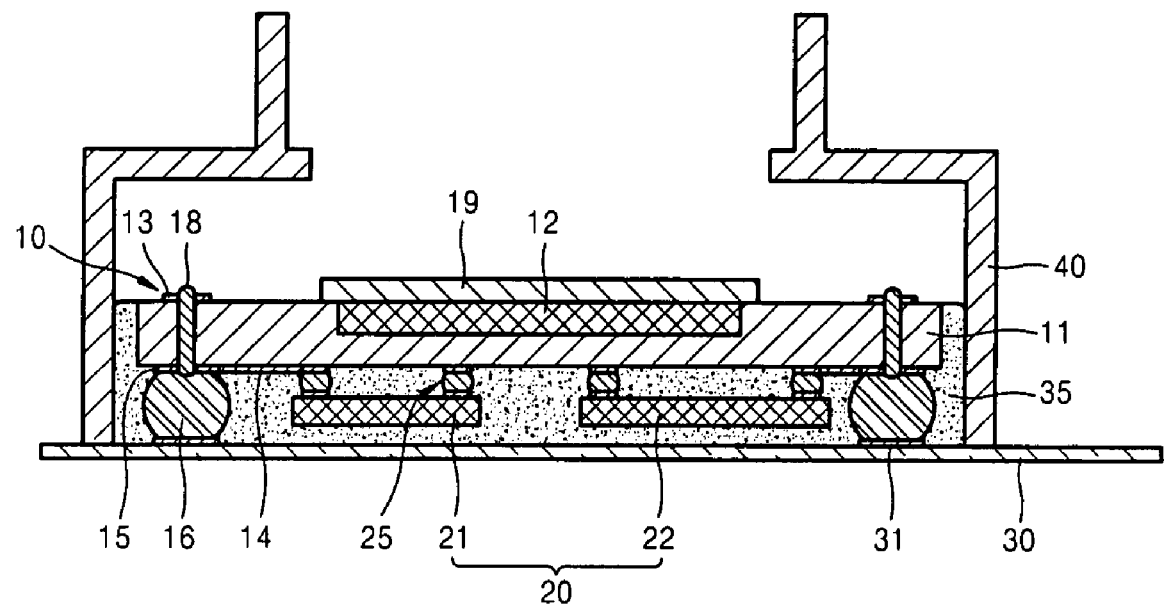
FIG. 6I illustrates a step of fixing the housing to the PCB.

FIG. 6I illustrates a step of fixing the housing 40 to the PCB 30. A variety of methods can be used for this purpose. For example, sealant (not shown) is dispensed around the upper surface of the FPCB 30. The housing 40 is arranged and placed on the FPCB 30 to fit to a sealant coating portion. By curing the sealant, the housing 40 is firmly fixed to the FPCB 30.

Figure 6J:
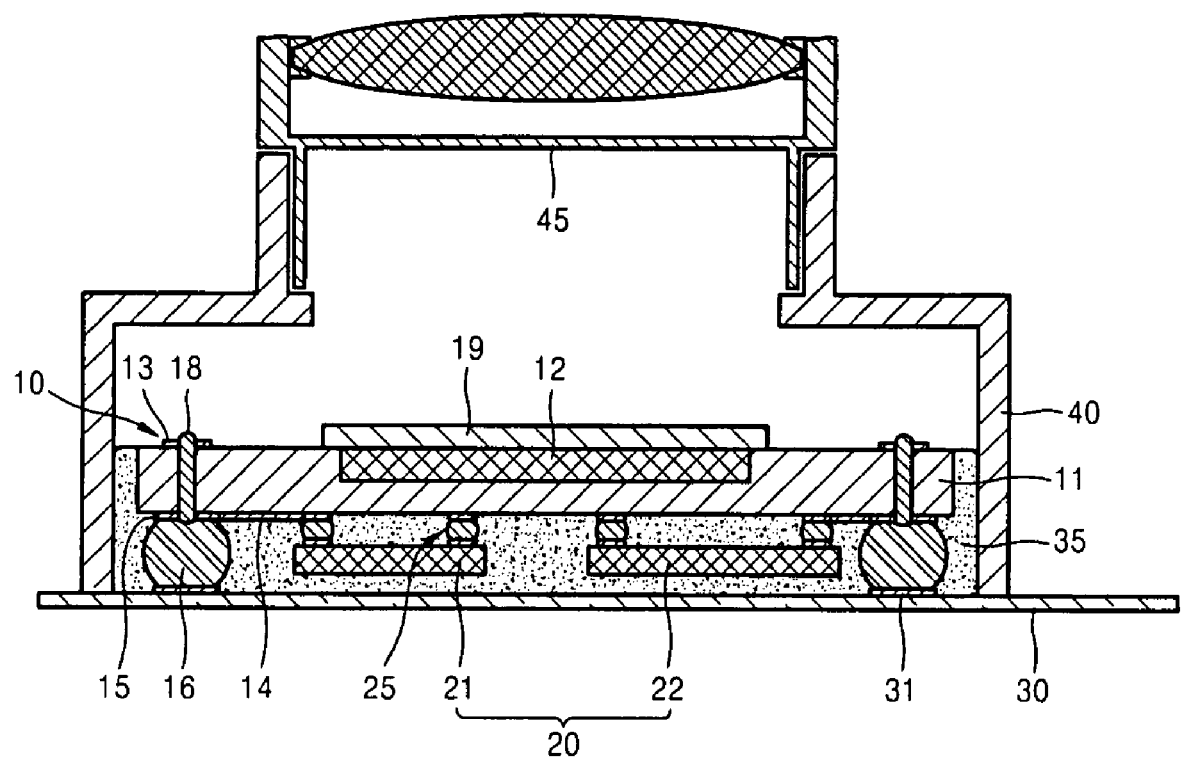
FIG. 6J illustrates a step of fixing the lens assembly to the housing.

FIG. 6J illustrates a step of fixing the lens assembly 45 to the housing 40. The upper portion of the housing 40 is open and screw threads are formed on the inner circumferential surface of the upper portion of the housing 40. The lens assembly 45 is screw coupled to the screw threads. Thus, the photographing device 12 and the DSP chip 21 are integrally packaged in the housing 40 and the FPCB 30 so that the chip package for an image sensor is complete.

In particular, the chip package for an image sensor according to the embodiment shown in FIG. 6J is effective in reducing the volume by integrating the first semiconductor chip 10, the second semiconductor chip 20, and the FPCB 30 in the vertical direction in the flip chip bonding method. Also, since the IR cut filter 19 is deposited on the upper surface of the first semiconductor chip 10, the volume of the chip package for an image sensor can be further reduced. In addition, since a lot of steps can be performed in the wafer level, the manufacturing time and costs can be reduced.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A chip package comprising:
    a first semiconductor chip with a first surface and a second surface opposite to the first surface, the first surface including a photographing device and a first circuit pattern, and the second surface including a second circuit pattern electrically connected to the first circuit pattern;
    a second semiconductor chip attached to the second circuit pattern;
    a printed circuit board facing the second surface of the first semiconductor chip, the printed circuit board transferring an electric signal externally from the chip package and to at least one of the first and second semiconductor chips; and
    a housing accommodating at least the first and second semiconductor chips, the housing allowing light to pass to the photographing device.

2. The chip package of claim 1, wherein the second semiconductor chip is one of a digital signal processor chip and a memory chip.

3. The chip package of claim 1, wherein the first and second circuit patterns are electrically connected via a hole in the first semiconductor chip.

4. The chip package of claim 3, wherein the hole in the first semiconductor chip is at least partially covered with tungsten.

5. The chip package of claim 4, wherein the tungsten in the hole is formed using a chemical vapor deposition process.

6. The chip package of claim 3, wherein the first and second circuit patterns are electrically connected by performing electro copper plating on the hole in the first semiconductor chip.

7. The chip package of claim 1, further comprising a filter formed on at least a portion of a surface of the photographing device.

8. The chip package of claim 1, wherein the second circuit pattern is connected to the printed circuit board by flip chip interconnection.

9. The chip package of claim 1 further comprising:
    a chip bond pad electrically connected to the second circuit pattern; and
    a bump on the chip bond pad,
    wherein a flip chip bond is made by connecting the bump to a conductive pad on the printed circuit board.

10. The chip package of claim 1, wherein at least a portion of a space remaining between the first semiconductor chip and the printed circuit board is filled with an electrically non-conductive material.

11. The chip package of claim 1, wherein the second semiconductor chip is attached to the second circuit pattern by flip chip interconnection.

12. A method of manufacturing a chip package, the method comprising:
    (a) forming a photographing device and a first circuit pattern on a first surface of a die;
    (b) forming a second circuit pattern on a second surface of the die, the second surface being opposite to the first surface;
    (c) electrically connecting the first and second circuit patterns;
    (d) connecting a semiconductor chip to the second circuit pattern using flip chip interconnection; and
    (e) connecting the second circuit pattern to a printed circuit board.

13. The method of claim 12, wherein steps (a) to (d) are performed in a semiconductor wafer level.

14. The method of claim 12, wherein the first and second circuit patterns are connected by depositing tungsten inside a hole by a chemical vapor deposition process.

15. The method of claim 12, wherein the first and second circuit patterns are connected by performing electro copper plating to a hole in the die.

16. The method of claim 12, further comprising the step of:
  after step (a), forming a filter on at least a portion of a surface of the photographing device.

17. The method of claim 16, wherein the filter is formed by a chemical vapor deposition process.

18. The method of claim 12, wherein the second circuit pattern is connected to the printed circuit board using flip chip interconnection.

19. The method of claim 18, wherein the flip chip interconnection is performed by attaching a bump formed on a chip bond pad that is electrically connected to the second circuit pattern to a conductive pad of the printed circuit board.

20. The method of claim 12, further comprising the step of:
  after step (e), filling at least a portion of a space remaining between the die and the printed circuit board with an electrically non-conductive material.

21. The method of claim 12, wherein the semiconductor chip is one of a digital signal processor chip and a memory chip.

22. A chip package comprising:
  a first semiconductor chip with a first surface and a second surface opposite to the first surface;
  a photographing device formed on the first surface;
  an infrared filter formed on at least a portion of a surface of the photographing device;
  a second semiconductor chip attached to the second surface;
  a flexible printed circuit board facing the second surface of the first semiconductor chip;
  a lens assembly allowing light to pass through to the infrared filter; and
  a housing attached to the printed circuit board and the lens assembly, the housing accommodating the first and second semiconductor chips,
  wherein the first semiconductor chip, the second semiconductor chip and the flexible printed circuit board are electrically connected using flip chip bonding.

* * * * *